(12) United States Patent
Venema et al.

(10) Patent No.: US 7,391,503 B2
(45) Date of Patent: Jun. 24, 2008

(54) SYSTEM AND METHOD FOR COMPENSATING FOR THERMAL EXPANSION OF LITHOGRAPHY APPARATUS OR SUBSTRATE

(75) Inventors: Willem Jurrianus Venema, Eindhoven (NL); Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 211 days.

(21) Appl. No.: 11/257,398

(22) Filed: Oct. 25, 2005

(65) Prior Publication Data

US 2007/0075315 A1    Apr. 5, 2007

Related U.S. Application Data

(60) Provisional application No. 60/722,951, filed on Oct. 4, 2005.

(51) Int. Cl.
*G03B 27/32* (2006.01)
*G03B 27/52* (2006.01)

(52) U.S. Cl. ............................................. 355/77; 355/30
(58) Field of Classification Search .................. 355/53, 355/77, 30, 52; 430/394
See application file for complete search history.

(56) References Cited

U.S. PATENT DOCUMENTS

| 5,229,872 | A | 7/1993 | Mumola |
| 5,296,891 | A | 3/1994 | Vogt et al. |
| 5,500,736 | A | 3/1996 | Koitabashi et al. |
| 5,523,193 | A | 6/1996 | Nelson |
| 5,530,482 | A | 6/1996 | Gove et al. |
| 5,579,147 | A | 11/1996 | Mori et al. |
| 5,677,703 | A | 10/1997 | Bhuva et al. |
| 5,808,797 | A | 9/1998 | Bloom et al. |
| 5,982,553 | A | 11/1999 | Bloom et al. |
| 6,133,986 | A | 10/2000 | Johnson |
| 6,177,980 | B1 | 1/2001 | Johnson |

(Continued)

FOREIGN PATENT DOCUMENTS

WO    WO 98/33096    7/1998

(Continued)

OTHER PUBLICATIONS

U.S. Appl. No. 11/257,399, filed Oct. 2005, Tinnemans et al.

(Continued)

*Primary Examiner*—Rodney E Fuller
(74) *Attorney, Agent, or Firm*—Sterne, Kessler, Goldstein & Fox P.L.L.C.

(57) ABSTRACT

To prevent a substrate from expanding significantly to generate overlay errors an exposure operation takes place in two parts. A first part exposes boundary areas and a second part exposes the larger, bulk areas. In one example, a portion of the substrate is fixed and the substrate is exposed progressively from parts furthest from the fixed portions towards the fixed portion. In another example, a plurality of high velocity scans take place instead of a single slow scan, and the substrate is allowed to cool between the high velocity scans. In another example, a lithographic apparatus is heated in order to maintain a temperature differential between the apparatus and the surrounding environment, and to minimize any fluctuation due to the exposing radiation.

6 Claims, 8 Drawing Sheets

U.S. PATENT DOCUMENTS

| | | | |
|---|---|---|---|
| 6,194,103 B1 * | 2/2001 | Tzu et al. | 430/5 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2004/0041104 A1 | 3/2004 | Liebregts et al. | |
| 2004/0130561 A1 | 7/2004 | Jain | |
| 2005/0007572 A1 | 1/2005 | George et al. | |
| 2005/0046816 A1 * | 3/2005 | Lin | 355/53 |
| 2005/0213067 A1 | 9/2005 | Van der Feltz | |

FOREIGN PATENT DOCUMENTS

| | | |
|---|---|---|
| WO | WO 98/38597 | 9/1998 |

OTHER PUBLICATIONS

U.S. Appl. No. 11/175,033, filed Jul. 2005.
U.S. Appl. No. 11/192,400, filed Jul. 2005.

* cited by examiner

US 7,391,503 B2

SYSTEM AND METHOD FOR COMPENSATING FOR THERMAL EXPANSION OF LITHOGRAPHY APPARATUS OR SUBSTRATE

CROSS REFERENCE TO RELATED APPLICATIONS

This application claims priority under 35 U.S.C. § 119(e) to U.S. Provisional Patent Appl. No. 60/722,951, filed Oct. 4, 2005, which is incorporated by reference herein in its entirety.

BACKGROUND

1. Field

The present invention relates to a lithographic apparatus and a device manufacturing method.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Lithographic apparatus can be subject to heavy use, during which parts of the apparatus can heat up causing them to expand. This can result in errors in the illumination/exposure of the substrate. For example, if the radiation projected through the lithographic apparatus is not homogenous, the parts through which radiation is projected can expand, while the parts through which no radiation is being projected will not expand. These thermal expansion effects can be cumulative and result in positional errors in the lithographic apparatus and errors in the exposure.

During exposure of the substrate large amounts of concentrated radiation can be projected onto the substrate which will cause it to heat up and expand. The expansion of all or parts of the substrate can result in overlay errors leading to faulty devices. This problem can be particularly pronounced when large areas of the substrate need to be exposed or when very high doses of radiation are used. Additionally, the problem can be compounded by subsequent exposures, later exposures are projected onto an already partially expanded substrate.

Therefore, what is desired is a system and method that reduce errors that can result from thermal expansion of the lithographic apparatus and/or substrate.

SUMMARY

In one embodiment of the present invention, there is provided a device manufacturing method comprising the following steps. Exposing a feature on a substrate, the feature having a boundary. The step of exposing the feature comprises performing a first exposure by projecting a modulated radiation beam onto the substrate to expose areas of the features within a predetermined distance of the boundary and performing a second exposure by projecting a modulated beam of radiation onto the substrate to expose at least a part of the feature not exposed in the first exposure.

In another embodiment of the present invention, there is provided a device manufacturing method comprising the following step. Fixing a portion of a substrate to a reference object to form a fixed portion of the substrate, the rest of the substrate remaining unfixed relative to the reference plate. Exposing the substrate progressively in such a way that when any point on the substrate is exposed no point between it and the closest part of the fixed portion has been exposed during the present exposure sequence.

In a further embodiment of the present invention, there is provided a lithographic apparatus comprising a projection system, a fixing device, and a controller. The projection system projects a modulated radiation beam onto a target portion of a substrate. The fixing device fixes a portion of the substrate to a reference object. The controller controls the lithographic apparatus to expose the substrate progressively in such a way that when any point on the substrate is exposed no point between it and the closest part of the fixed portion has previously been exposed during the present exposure sequence.

In a still further embodiment of the present invention, there is provided a device manufacturing method comprising the following steps. Providing a substrate that is at least partially covered by a layer of radiation-sensitive material. Exposing a pattern feature on the substrate. The step of exposing comprises performing a first illumination by projecting a modulated beam of radiation onto the substrate for a first duration, the first duration being insufficient to expose the radiation-sensitive material to form the pattern feature, waiting for a cooling duration, the cooling duration being sufficient to allow the substrate to cool below a predetermined temperature, and performing a second illumination by projecting a modulated beam of radiation onto the substrate for a second duration. The steps of waiting for a cooling duration and performing a second illumination are repeated until the radiation-sensitive material is sufficiently exposed to form the pattern feature.

In yet another embodiment of the present invention, there is provided a lithographic apparatus comprising a substrate table, a projection system, and a controller. The substrate table supports a substrate at least partially covered by a layer of radiation-sensitive material. The projection system projects a modulated radiation beam onto a target portion of the substrate. The controller controls the lithographic apparatus. A first illumination is performed by projecting a modulated beam of radiation onto the substrate for a first duration, the first duration being insufficient to expose the radiation-sensitive material to form a pattern feature. After waiting for a cooling duration, the predetermined duration being sufficient to allow the substrate to cool below a predetermined temperature, a second illumination is performed by projecting a modulated beam of radiation onto the substrate for a second duration. The steps of waiting for a cooling duration and performing a second illumination are repeated until the radiation-sensitive material is exposed.

In a still further embodiment of the present invention, there is provided a device manufacturing method comprising the following steps. Using a projection system to project a modulated beam of radiation onto a substrate. During the projection, heating at least one of the projection system and the substrate to at least a predetermined temperature, the predetermined temperature being significantly above room temperature.

In another embodiment of the present invention, there is provided a lithographic apparatus comprising a substrate table that supports a substrate, a projection system, and a heating system. The projection system projects a patterned projection beam onto a target portion of a substrate and the heating system heats at least one of the projection system and the substrate table.

In still further embodiment of the present invention there is provided a device manufacturing method comprising the following steps. Providing a substrate at least partially covered with a layer of radiation-sensitive material. Projecting a first modulated beam of radiation, having a first wavelength, onto a substrate. Projecting a second beam of radiation, having a second wavelength onto the substrate. The first wavelength is a wavelength at which the radiation-sensitive material is sensitive and the second wavelength is a wavelength at which the radiation-sensitive material is not sensitive.

In yet another embodiment of the present invention, there is provided a lithographic apparatus comprising an illumination system, a substrate table, and a projection system. The illumination system conditions a radiation beam. The substrate table supports a substrate at least partially covered in a layer of radiation-sensitive material. The projection system projects the modulated radiation beam onto a target portion of the substrate. The illumination system can condition a radiation beam at two wavelengths, the first of which has a wavelength at which the radiation-sensitive material is sensitive and the second of which the radiation-sensitive material is not sensitive.

In yet a still further embodiment of the present invention, there is provided a device manufacturing method comprising the following steps. Providing a substrate table constructed to support a substrate. Projecting a projection beam of radiation onto a substrate using a projection system. At least one of the substrate table or a part of the projection system is coated in a material that has a transition between a state in which large amounts of heat are generated when an electromagnetic field is applied to the material and a state in which small amounts of heat are generated when an electric or magnetic field is applied to the material.

In a still further embodiment of the present invention, there is provided a lithographic apparatus comprising a substrate table and a projection system. The substrate table supports a substrate. The projection system projects a patterned projection beam onto a target portion of the substrate. At least one of the substrate table or a part of the projection system is coated in a material that has a transition between a state in which large amounts of heat are generated when an electric or magnetic field is applied to the material and a state in which small amounts of heat are generated when an electromagnetic field is applied to the material.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
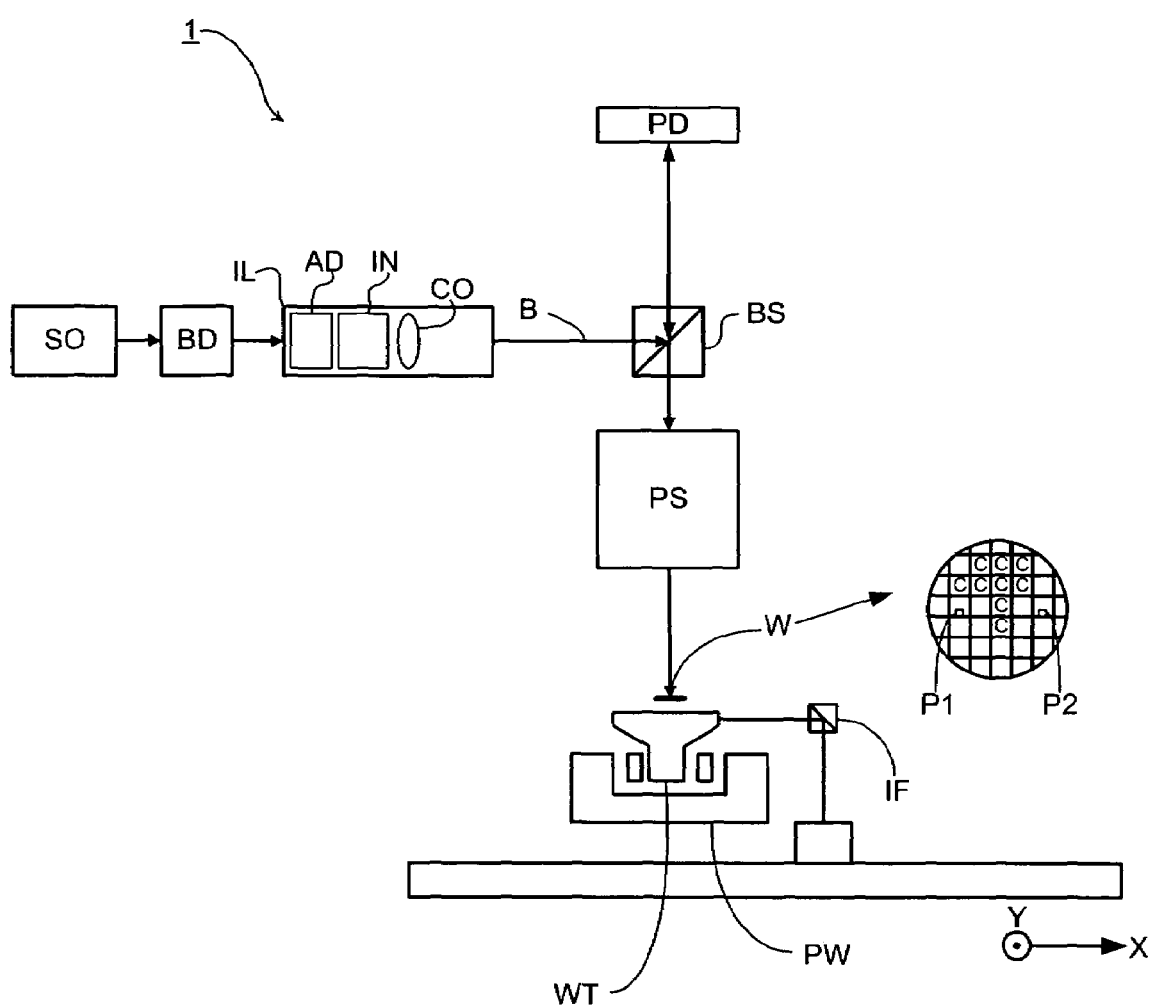
FIGS. 1 and 2 depict lithographic apparatus, according to various embodiments of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features.

Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 μm, e.g., at least 100 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
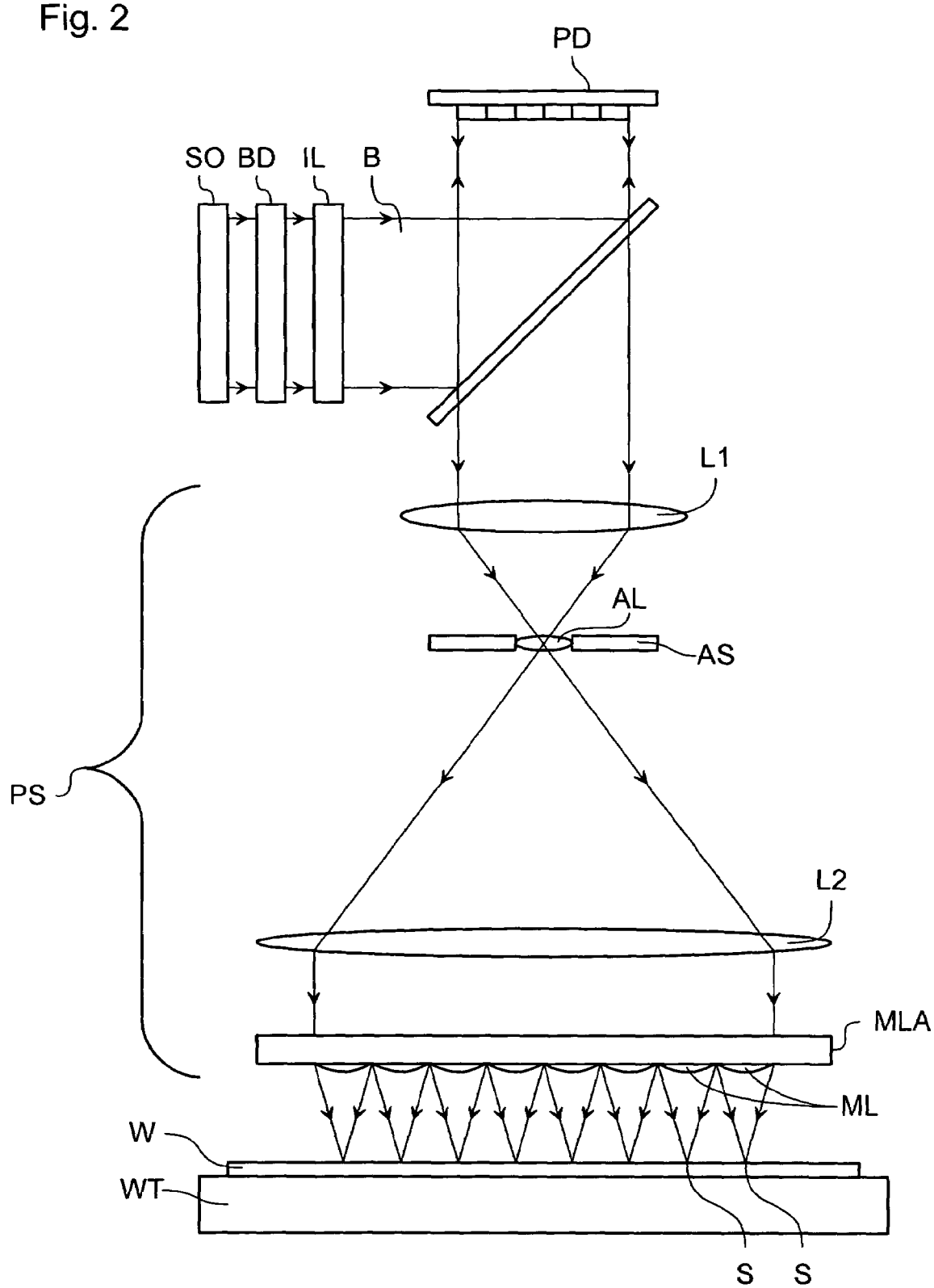

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes abeam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
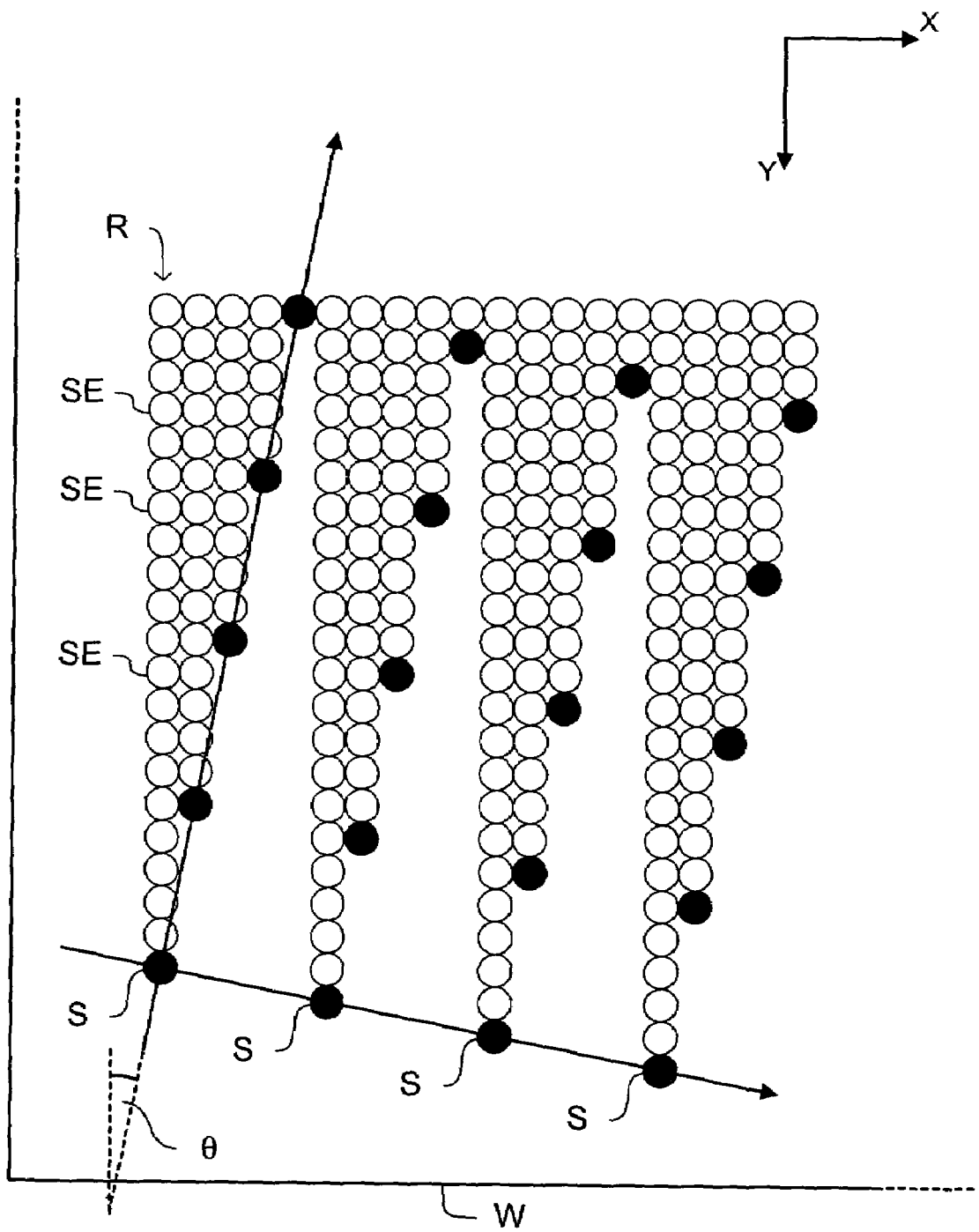
FIG. 3 depicts a mode of transferring a pattern to a substrate using an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 10°, at most 0.5°, at most 0.25°, at most 0.10°, at most 0.05°, or at most 0.01°. In one example, the angle θ is at least 0.001°.

Figure 4:
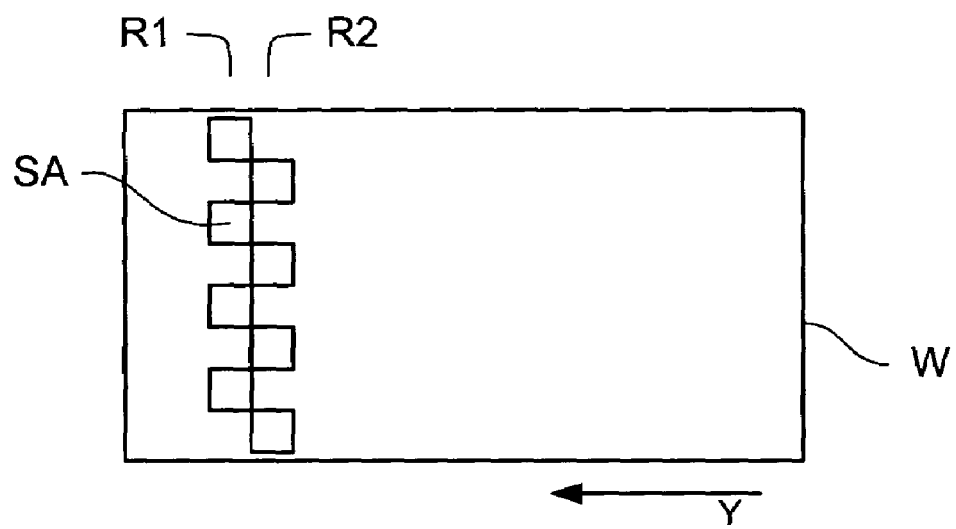
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots S slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

According to a first embodiment of the invention the exposure of a feature or pattern can be divided into two or more exposures: a first exposure to expose the radiation-sensitive material for the boundary areas of the feature(s) and subsequent exposure(s) to expose the radiation-sensitive material for the larger, bulk areas of the feature(s) or patterns. A greater accuracy is generally required for the boundary or detailed areas and this is achieved during the first exposure. Because the area exposed during the first exposure is small, only a relatively small amount of energy is projected onto the substrate so the substrate may not heat up or expand significantly. Thus, the finer details of the feature(s) can be exposed without subjecting the substrate or lithographic apparatus to significant heating effects, so that any overlay errors can be minimized. The second exposure or exposures expose the larger, bulk areas of the features and less accuracy is required for these exposures.

Figure 5A:
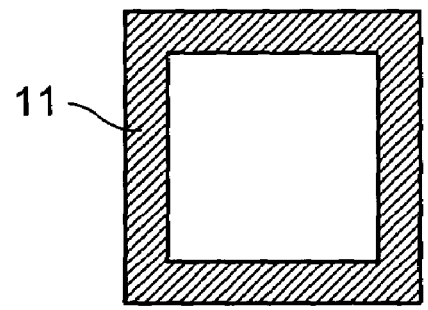
FIGS. 5a, 5b and 5b depict the stages of exposure in exposing a substrate, according to a first embodiment of the invention.
Figure 5B:
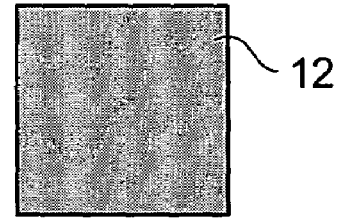

FIGS. 5a, 5b and 5b depict the stages of exposure in exposing a substrate, according to a first embodiment of the invention.

As shown in FIG. 5a, an outer area of a feature 11, e.g., the area within a predetermined distance of the boundary, is exposed during a first exposure. The finer details of the feature are exposed. The predetermined distance is such that the area exposed during the first exposure is sufficiently small that the heat imparted to the substrate W does not cause any significant thermal expansion. In particular, any resulting thermal expansion must be sufficiently small not to cause overlay errors. Thus, the predetermined distance can vary according to the feature being exposed and the accuracy required. The predetermined distance is generally larger than the sum of the displacement caused by expansion of the projection system and the displacement caused by expansion of the substrate W. The particular predetermined distance can be found by experimentation. For example, a variety of predetermined distances can be attempted, and the resulting expansion measured to choose the optimum predetermined distance. Alternatively, a theoretical calculation of the resulting expansion from a particular predetermined distance can be calculated, and an appropriate predetermined distance chosen.

The area exposed by the second exposure 12 is shown in FIG. 5b, and as can be seen the area exposed during this exposure is comparatively large. The accuracy required during this second exposure is less than that required for the first exposure. In one example, there can be some overlap between the areas exposed by the first and subsequent exposures.

Figure 5C:
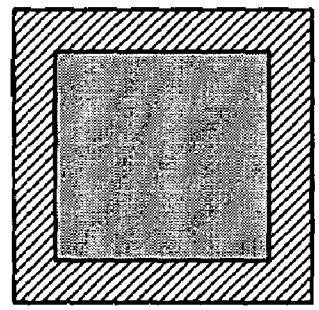

FIG. 5c shows the entire feature exposed by a combination of the first and second exposures. In one example, neighboring features are then exposed in similar manner.

Figure 6A:
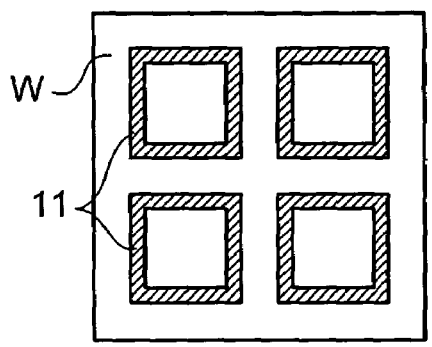
FIGS. 6a, 6b and 6c depict the stages of exposing a region of a substrate, according to another embodiment of the invention.
Figure 6B:
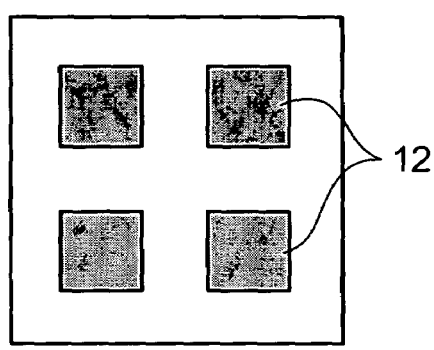
Figure 6C:
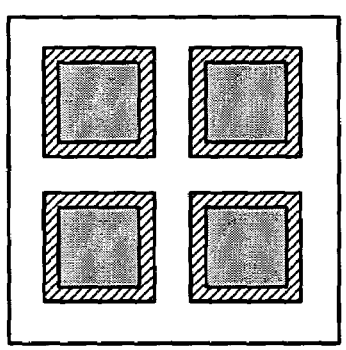

FIGS. 6a, 6b and 6c depict the stages of exposing a region of a substrate, according to another embodiment of the invention. FIGS. 6a to 6c show features exposed simultaneously in a particular region of the substrate. All of the boundary areas or fine details of features within a particular region of the substrate or the entire substrate can be exposed during the first exposure, as shown in FIG. 6a. This further prevents heat resulting from the exposure of one feature from heating the substrate before the boundary regions of neighboring regions have been exposed. The larger areas of the features 12 are then exposed in a subsequent exposure as shown in FIG. 6b, resulting in complete features as shown in FIG. 6c.

Although the examples above show a first exposure and just a single subsequent exposure there could be a plurality of subsequent exposures, each exposing a part of the larger, coarse fill area. Similarly, there could be a plurality of fine exposures, each exposing a part of a boundary area of the substrate W. The first and second exposures can be done using a single lithographic apparatus or alternatively different lithographic apparatus can be used for the different exposures.

Figure 7:
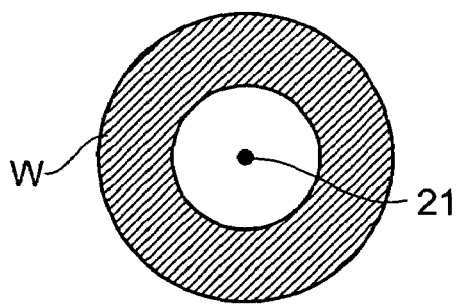
FIG. 7 depicts a partially exposed substrate, according to a second embodiment of the invention.

FIG. 7 depicts a partially exposed substrate, according to a second embodiment of the invention. According to this second embodiment, a portion of the substrate is fixed relative to a reference plate, while the remainder of the substrate is unfixed. This can be achieved by mechanically constraining the fixed portion of the substrate, for example, by clamping a portion of the substrate W, securing it by means of a vacuum gripper or otherwise. Parts of the substrate furthest from the fixed portion are exposed first, progressively exposing portions closer to the fixed portion. In one example, when any point on the substrate is exposed, no point between it and the closest part of the fixed portion has been exposed during a particular sequence of exposures, i.e., during the exposure of this layer of radiation sensitive material. Thus, the regions furthest from the fixed portion can expand due to the heat generated by the exposure, but the as yet unexposed portions will be unaffected so overlay errors resulting from thermal expansion of the substrate will be reduced.

FIG. 7 depicts a substrate that is part-way through being exposed, in which the fixed portion is in the form of an internal point 21. The point can be, as in this instance, central. The hashed parts of the substrate have already been exposed. As can be seen, parts of the substrate furthest from the fixed central point are exposed first, moving progressively towards the central fixed point.

Figure 8:
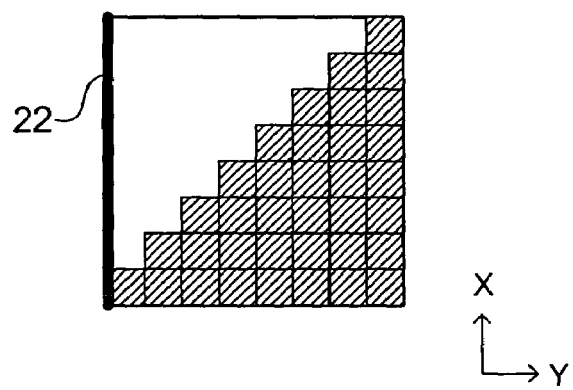
FIG. 8 depicts another partially exposed substrate, according to a second embodiment of the invention.

FIG. 8 depicts another partially exposed substrate, according to a second embodiment of the invention. FIG. 8 depicts a substrate in which the fixed portion is in the form of a lateral edge 22. The substrate depicted in FIG. 8 is being exposed by a lithographic apparatus in step mode, and the substrate W can be seen as divided into individual target portions C. Each individual target portion is exposed then the substrate W moved to expose another target portion. The substrate is exposed progressively from the points furthest from the fixed lateral edge towards the lateral edge. Although some parts adjacent to the fixed lateral edge have been exposed, while some parts furthest away from the lateral edge have not been exposed, during exposure of any point on the substrate no point between the point of exposure and the closest part of fixed portion has been exposed. Thus, the location of the point being exposed relative to the fixed lateral edge is substantially unaltered.

Alternatively, a lithographic apparatus in scan mode could be used to expose the substrate W. For example, the scan direction (Y) can be perpendicular to the lateral edge 22 such that the substrate is scanned from the edge furthest from the lateral edge towards the lateral edge 22.

Figure 9:
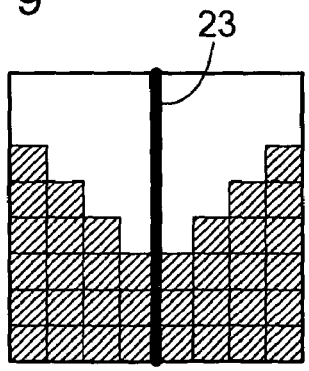
FIG. 9 depicts another partially exposed substrate, according to a second embodiment of the invention.

FIG. 9 depicts another partially exposed substrate, according to a second embodiment of the invention. FIG. 9 depicts a substrate in which the fixed portion is an internal strip, i.e., a portion not bounding an outer edge of the planar substrate. Again, the substrate here is depicted as having been exposed by a lithographic apparatus in step mode, and when any given point on the substrate is exposed, no point between it and the closest part of the fixed internal strip has been exposed. Although in this instance portions of the substrate on both sides of the internal strip are exposed, the entire of the substrate on one side of the internal strip could be exposed before exposing the substrate on the other side of the internal strip.

According to a third embodiment of the invention, a reduced amount of radiation is used per exposure, such that only a limited amount of heat is introduced to the substrate and thermal expansion during the exposure is limited. A single short exposure is insufficient to fully expose the radiation-sensitive material, so a plurality of short exposures take place to fully expose the radiation-sensitive material. Between each exposure the substrate is allowed to cool. The substrate can either be left for a predetermined time or until it is below a predetermined temperature. Thus, a substantial proportion of the heat from earlier exposures will have dissipated before the subsequent exposure so any thermal expansion will have been substantially reversed. As a consequence of the shorter exposure length the exposures are generally relatively fast scan exposures.

In one example, during a first exposure the substrate is scanned at a relatively high velocity, and consequently the amount of radiation projected onto the radiation-sensitive material is insufficient to fully expose the radiation-sensitive material. The substrate is then allowed to cool either for a predetermined time or to a predetermined temperature. The substrate is then subjected to a second exposure at a high velocity. The second exposure can be a projection of the same modulated beam at the same high velocity. Alternatively, the modulation of the beam can be slightly different and/or the modulated beam slightly offset from the first modulated beam of radiation. This can be used to create a variety of grayscale effects. If the combined effect of the first and second exposures is sufficient to fully expose the radiation-sensitive material, then the exposure is complete. On the other hand, if the combined effect of the first and second exposures is insufficient to fully expose the radiation-sensitive material, the steps of allowing the substrate to cool and exposing it again are repeated until the radiation-sensitive material is fully exposed.

In one example, to determine whether the substrate has cooled below a predetermined temperature the temperature of the substrate can be measured using a thermometer. The temperature below which the substrate must be or the predetermined time elapsed before the substrate is subjected to subsequent exposures will vary according to the particular circumstances. These will depend on the accuracy required, the radiation-sensitive material used, the exact nature of the substrate, and the concentration of radiation in the earlier exposure.

In one or more embodiment or examples, although more exposures are required per substrate, the throughput is at least partially compensated because the scan exposures are faster. The lithographic apparatus can be configured such that, while one substrate is cooling between exposures another is being exposed, after which the substrates are switched.

According to a fourth embodiment, the lithographic apparatus, or at least the optical parts of it, are heated by a heater and substantially maintained at a temperature above room temperature. As the temperature difference between the apparatus and the surroundings is large, there will be a significant energy flow between the apparatus and the surroundings. The effect of some additional heat from the exposing radiation will be lowered because the temperature differential between the apparatus and the surroundings is large, so the extra heat will be dissipated relatively quickly. Thus, the effect of localized thermal expansion is minimized and the overlay is improved. Furthermore, as the heating of the apparatus is temperature controlled, when the apparatus is heated by the projection beam, the heater will be controlled to proved less heat.

In one example, the projection system is heated by a heating device to a predetermined temperature. A thermometer detects this temperature and a controller controls the heating device to maintain the projection system at a predetermined temperature. Alternatively or additionally, a heating device can heat the substrate table (and thus also the substrate) to a predetermined temperature and a controller operates to maintain the substrate table at the predetermined temperature.

According to a fifth embodiment of the present invention, when the projection beam is not uniform (i.e., it is patterned), as is usually the case, portions of the projection system PS through which the exposing radiation is projected heat up more than the parts through which exposing radiation is not projected. To prevent significant temperature variations, and thus thermal expansion variations, between different parts of the lithographic apparatus from occurring, a second projection beam is projected through the apparatus. The second projection beam has a wavelength at which the radiation-sensitive material is not sensitive. For example, the wavelength can be much higher or much lower than that of the first projection beam. The total energy absorbed across a cross-section of the projection system is therefore more uniform and temperature variations, and thus variations in the thermal expansion, are minimized. As the second projection beam does not actually expose the radiation-sensitive material, it is not necessary for the second projection beam to be in focus. The second projection beam can be projected through the projection system at times when the first projection beam is not being projected through the projection system. For example, when a new substrate is being positioned at the focal point of the projection system or when the substrate is being moved to position a new target portion at the focal point of the projection system. The second projection beam can have no pattern, but optionally the second projection beam is a negative image of the pattern of the first projection beam. When this occurs, the energy from the second projection beam is projected through part of the projection system through which no energy was projected by the first projection beam, and the total energy flux across the projection system over time is substantially constant. As the second projection beam has a different wavelength, the amount of energy absorbed by the apparatus as a result also differs.

Figure 10:
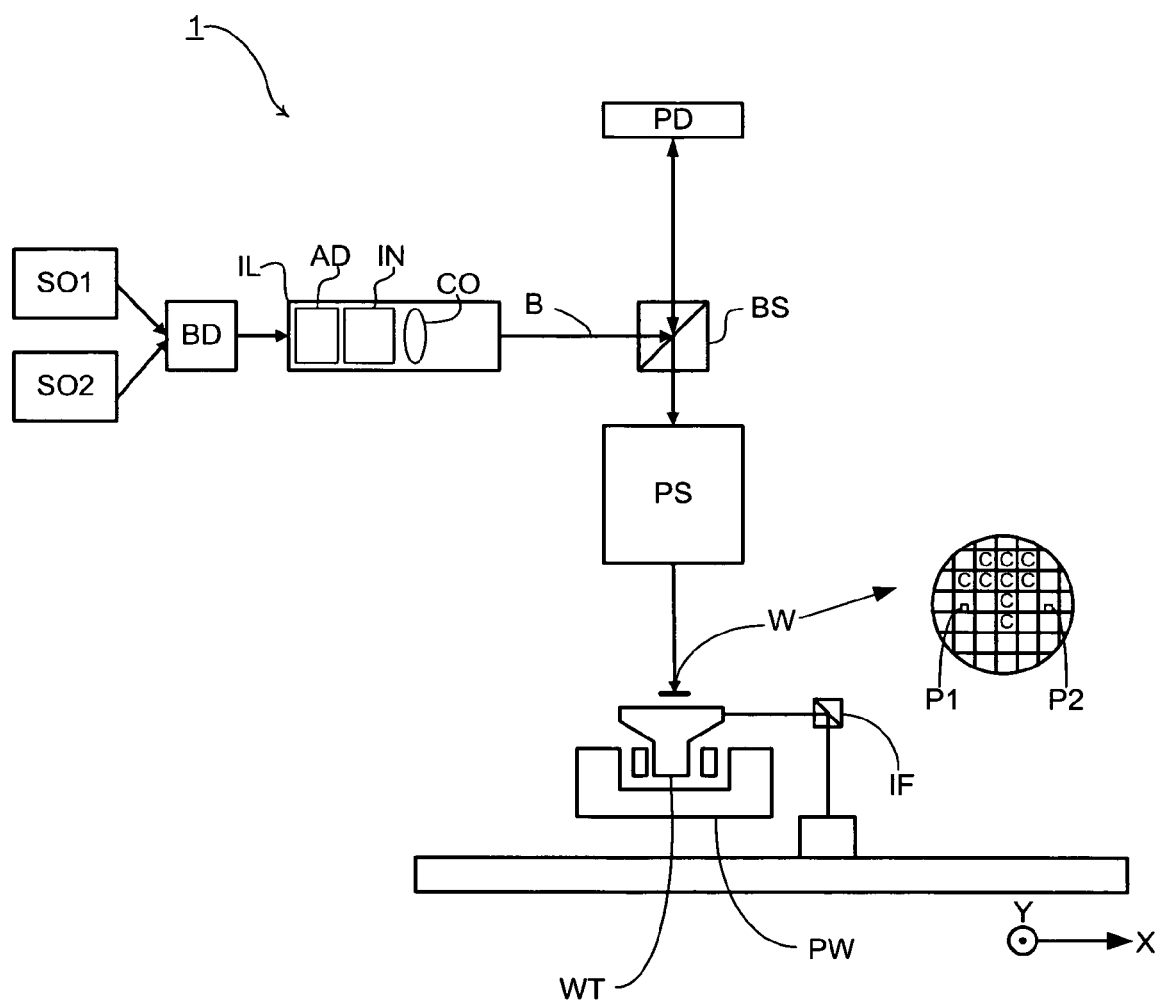
FIG. 10 depicts a lithographic apparatus, according to another embodiment of the invention.

FIG. 10 depicts a lithographic apparatus, according to another embodiment of the invention. As can be seen in FIG. 10, the above can be achieved by having two radiation sources SO1 and SO2. The first radiation source SO1 is used to generate the radiation beam for exposing the radiation-sensitive material. Once the exposure using this beam is complete, for example after a target portion of the substrate has been exposed and while the substrate is being moved relative to the projection system, a second radiation beam is generated by second radiation source SO2. Second radiation source SO2 generates a beam of, for example, higher wavelength than the first radiation source SO1. Alternatively, the two projection beams, generated by first and second radiation sources SO1 and SO2, can be projected simultaneously using, for example, a half mirror to combine them prior to projection through the projection system. The patterned projection beam can be the negative pattern of the first pattern projection beam generated by the first radiation source SO1. Although the use of two radiation sources to generate the two projections beams is described here, any method of generating two projections beams of different wavelengths could also be used.

Alternatively, a single radiation source could be used to generate both the first a second projection beam, both radiation beams having the same wavelength. After the first patterned projection beam has exposed the radiation-sensitive material, a shutter at the end of the projection system nearest the substrate is shut and prevents radiation from the second projection beam from being directed onto the substrate W. The second patterned projection beam PB, having a pattern which is the negative image of the first projection beam, is then projected through the projection system, but not onto the substrate W due to the presence of the shutter. Thus, the total radiation across a cross-section of the projection system over time is constant.

In a sixth embodiment of the invention, a vapor is introduced into the lithographic apparatus, for example into the projection system in particular. The vapor is chosen to have a suitable boiling point above room temperature, such that any parts of the apparatus below the boiling point are heated to the boiling point as the vapor condenses.

Figure 11:
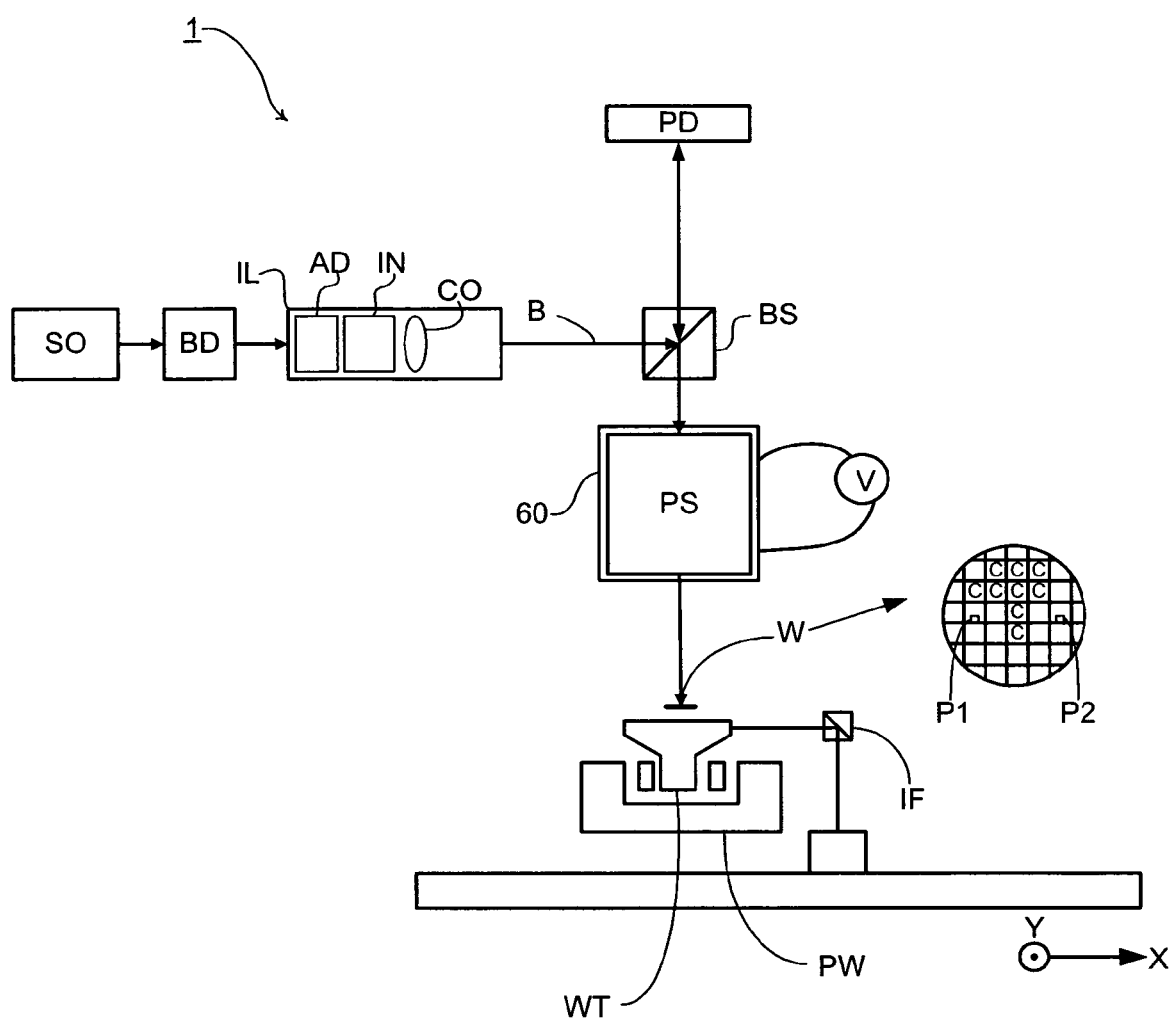
FIG. 11 depicts a lithographic apparatus, according to yet another embodiment of the invention.

FIG. 11 depicts a lithographic apparatus, according to yet another embodiment of the invention. According to another method of maintaining a stable temperature and/or preventing non-uniform heating effects, the projection system is coated in a resistive material with a positive temperature coefficient and a sharp phase transition between a state of low resistivity at low temperature and high resistivity above the transition temperature (e.g., the Curie temperature). A sharp phase transition is one in which the resistance changes quickly with changing temperature compared the rate of change at significantly higher or lower temperatures. A voltage is applied and the resistive material causes the projection system to heat up to a temperature just below the transition temperature in a uniform fashion. Any marginal increase in the temperature caused by the exposing radiation will cause the resistivity of the resistive material to increase due to the phase transition, thus decreasing the heat dissipation due to the electric current. The projection system PS will thus be kept at a substantially uniform constant temperature. The resistive material can be applied to any part of the apparatus that it is necessary to keep at a substantially constant uniform temperature. The resistive material should be chosen to have a transition temperature suitable for the apparatus and the required use of the apparatus. For example, a Curie temperature can be about 10°-20° K. above the environment temperature. Barium Titanate BaTiO3 doped with a rare earth metal such as Yttrium Y or Lanthanum La are examples of resistive material. The transition temperature of the Barium Titanate can be chosen by varying the degree of doping. As an alternative, a material such a Gallium which has a structural phase transition at the transition temperature can be used.

As can be seen in FIG. 11, the projection system has been coated in a resistive material 60 and there is a voltage source V for applying a voltage to the projection system PS. Although only the outside of the projection system is depicted as being coated in resistive material 60, additionally or alternatively individual component parts of the projection system can be coated in such a resistive material. The resistive material for such use can thus be transparent at the wavelength of the projection beam. Alternatively or additionally, the patterning device, or the frame bearing the patterning device (for example an array of individually controllable elements) can be coated in such a resistive material. Additionally or alternatively, the substrate table can be coated in such a resistive material.

Figure 12:
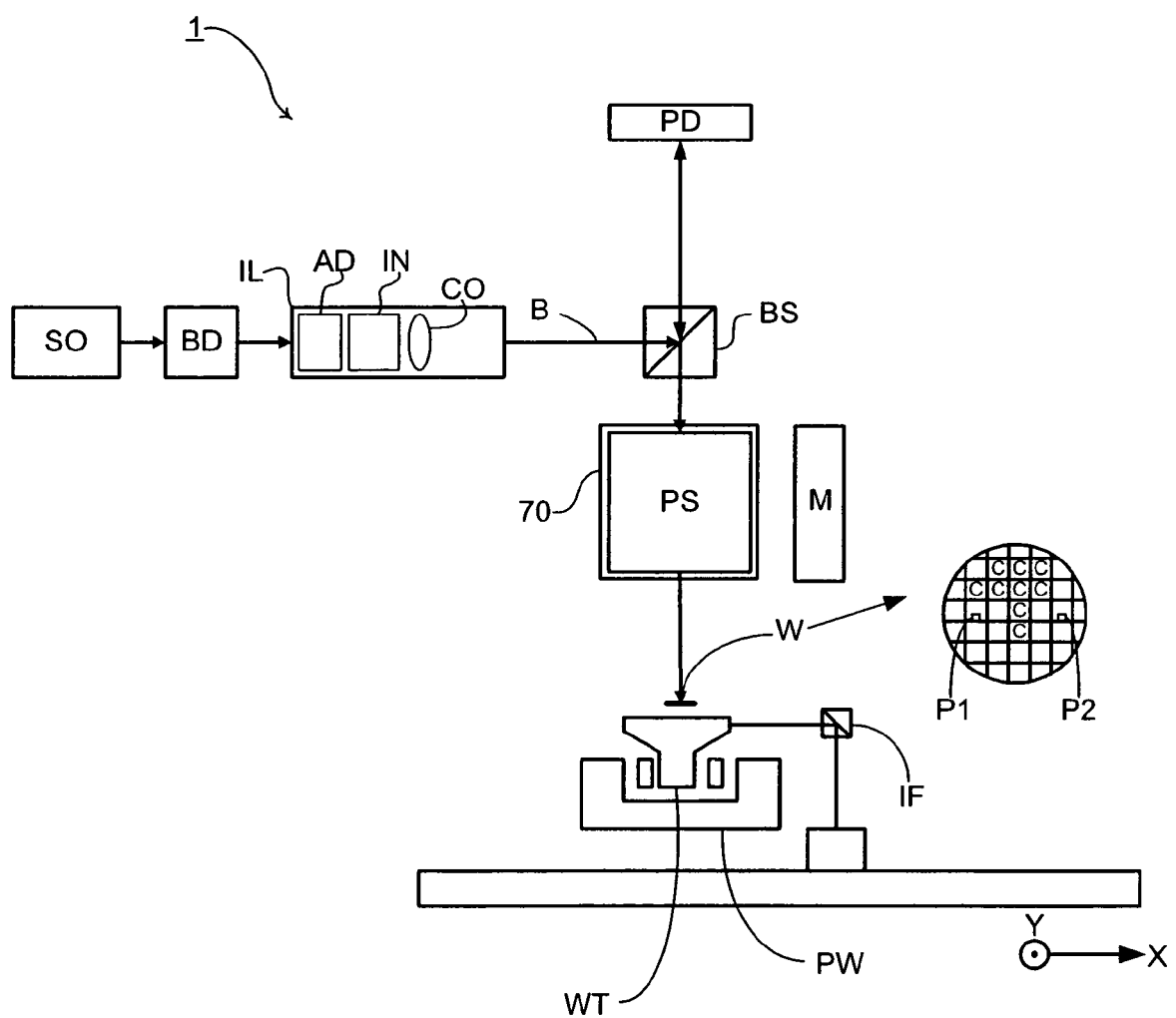
FIG. 12 depicts a lithographic apparatus, according to still another embodiment of the invention.

FIG. 12 depicts a lithographic apparatus, according to still another embodiment of the invention In this method of maintaining a stable temperature and/or preventing non-uniform heating effects, the projection system is coated in a material that undergoes a sharp phase transition between a magnetically ordered state below a transition temperature and a magnetically less ordered state above the transition temperature. A sharp phase transition is one in which the degree of magnetic order changes quickly with changing temperature compared to the rate of change of magnetic order at significantly higher or lower temperatures. Thus, when an alternating magnetic field is applied to the projection system, coating hysteretic heating will be caused in the material causing it to be heated to a temperature just below the transition temperature. Again, when additional heat is input by exposing radiation, the heat dissipation due to the varying magnetic field will automatically drop, which keeps the projection system at a substantially constant uniform temperature. Again, such a material causing this effect can alternatively or additionally be used to coat at least one of individual elements of the projection system, the patterning device, and the substrate table. The material should be chosen to have a suitable transition temperature for the apparatus and required use. A suitable transition temperature can be about 10°-20° K. above the environment temperature. In one example, Chromium Oxide Cr2O3 with a transition temperature of about 307° K. can be used. In various examples, the magnetically ordered state is one of ferromagnetic and ferrimagnetic.

As can be seen in FIG. 12, the projection system has been coated in a material 70 which causes hysteretic heating at a temperature below the transition temperature when a varying magnetic field is applied. There is also a coil M for generating a varying magnetic field. Although a coil is described here, any method of generating a varying magnetic field can be used.

As will be clear to the skilled person each of the embodiments can be used in combination with one or more of the other embodiments.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g. a thin film transistor layer and/or a color filter layer.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g., semiconductor memory, magnetic or optical disk) having such a computer program stored therein.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A device manufacturing method comprising:
    exposing a feature on a substrate, the feature having a boundary, comprising,
        performing a first exposure by projecting a modulated radiation beam onto the substrate to expose a fine perimeter area the feature within a predetermined distance of the boundary,
        measuring an expansion of the exposed fine perimeter area; and
        performing a second exposure, based upon the measured expansion by projecting the modulated beam of radiation onto the substrate to expose a coarse inside area of the feature, separate from the fine perimeter area, unexposed during the first exposure.

2. The method of claim 1, wherein substantially all the coarse inside area of the feature unexposed in the first exposure is exposed in the second exposure.

3. The method of claim 1, wherein:
    a plurality of the features are exposed on the substrate; and
    during the first exposure areas within a predetermined distance of all the boundaries of the features within a region of the substrate are exposed by projecting the modulated radiation beam onto the substrate.

4. The method of claim 1, wherein the step of exposing the feature further comprises:
    performing a third exposure by projecting the modulated beam of radiation onto the substrate to expose at least a part of the feature unexposed in the first exposure.

5. The method of claim 1, wherein the fine perimeter area is substantially smaller than the coarse inside area.

6. The method of claim 1, wherein the predetermined distance is greater than a sum of a displacement caused by the expansion of the substrate and an expansion of a projection system used for performing the first and the second exposures.

\* \* \* \* \*

UNITED STATES PATENT AND TRADEMARK OFFICE
CERTIFICATE OF CORRECTION

| | |
|---|---|
| PATENT NO. | : 7,391,503 B2 |
| APPLICATION NO. | : 11/257398 |
| DATED | : June 24, 2008 |
| INVENTOR(S) | : Venema et al. |

It is certified that error appears in the above-identified patent and that said Letters Patent is hereby corrected as shown below:

<u>Column 20</u>
Line 9 please replace "perimeter area the" with --perimeter area of the--.

Signed and Sealed this

Twenty-sixth Day of August, 2008

JON W. DUDAS
*Director of the United States Patent and Trademark Office*